United States Patent [19]
Hynecek

[11] Patent Number: 5,872,484
[45] Date of Patent: Feb. 16, 1999

[54] HIGH PERFORMANCE CURRENT OUTPUT AMPLIFIER FOR CCD IMAGE SENSORS

[75] Inventor: Jaroslav Hynecek, Richardson, Tex.

[73] Assignee: Texas Instruments Incorporated, Dallas, Tex.

[21] Appl. No.: 893,821

[22] Filed: Jul. 11, 1997

[51] Int. Cl.⁶ .................................. H03F 3/16; H03F 3/08
[52] U.S. Cl. ............................................. 330/277; 330/308
[58] Field of Search ...................................... 330/277, 253, 330/257, 308, 310, 311; 250/214 A

[56] References Cited

U.S. PATENT DOCUMENTS 4,075,576   2/1978   Eden ........................................ 330/277
5,600,451   2/1997   Maki ......................................... 358/483

*Primary Examiner*—Robert Pascal
*Assistant Examiner*—Patricia Nguyen
*Attorney, Agent, or Firm*—Alan K. Stewart; Wade James Brady, III; Richard L. Donaldson

[57] ABSTRACT

The current output amplifier for a charge coupled device includes: a charge detection node 56; a first transistor 52 having a gate coupled to the charge detection node 56; a second transistor 50 having a gate coupled to a source of the first transistor 52 and a drain coupled to an output node 62; and a constant current source 60 coupled to the drain of the second transistor 50.

12 Claims, 2 Drawing Sheets

HIGH PERFORMANCE CURRENT OUTPUT AMPLIFIER FOR CCD IMAGE SENSORS

FIELD OF THE INVENTION

This invention generally relates to image sensors and in particular it relates to current output amplifiers for CCD image sensors.

BACKGROUND OF THE INVENTION

Essential to good performance of a CCD image sensor is the charge detection amplifier which converts charge stored at an individual photosite into a signal of adequate magnitude for further processing. For high speed CCD image sensors, there is a difficulty associated with the output of the signal from the CCD circuit. Referring to FIG. 1, a prior art charge detection amplifier is shown. The charge detection amplifier of FIG. 1 is a multiple source follower circuit with an optional bipolar transistor 20 bonded in the same package to drive an off chip loading capacitance 22. The circuit of FIG. 1 includes a detection circuit 23 which includes a floating diffusion detection node 24 (typically a reverse biased N–P junction), a reset element 26, reset signal $\phi_{RS}$, and reference voltage $V_{REF}$; three stage source follower which includes transistors 30–32 and constant current sources 34–36; source voltage $V_{dd}$; bipolar transistor 20; resistor 38; loading capacitance 22; and output voltage $V_{out}$. Since the multiple stages cause a delay and a loss of gain, it is not advantageous to continue in this direction with more stages. After about three stages, no advantage is gained from this design. Also, the loading capacitance 22 loads the output transistor which becomes a problem at higher frequencies.

SUMMARY OF THE INVENTION

Generally and in one form of the invention, the current output amplifier for a charge coupled device includes: a charge detection node; a first transistor having a gate coupled to the charge detection node; a second transistor having a gate coupled to a source of the first transistor and a drain coupled to an output node; and a constant current source coupled to the drain of the second transistor.

DETAILED DESCRIPTION OF PREFERRED EMBODIMENTS

Figure 2:
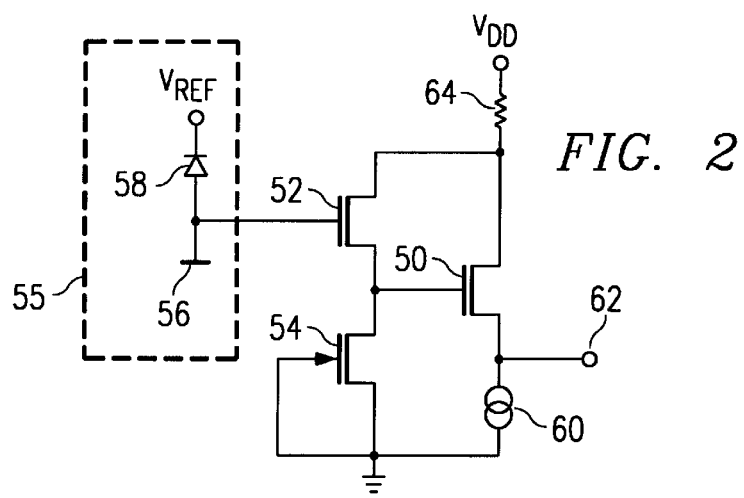
FIG. 2 is a schematic diagram of a preferred embodiment CCD current output charge detection amplifier.

Referring to FIG. 2, a circuit diagram of a preferred embodiment CCD charge detection amplifier is shown. The circuit includes PMOS transistor 50; NMOS transistor 52; transistor 54 which serves as a constant current load for transistor 52; floating gate detection circuit 55 which includes floating gate detection node 56, bias diode 58, and reference voltage $V_{REF}$; current source 60; output node 62; resistor 64; and supply voltage $V_{dd}$. This circuit is essentially a source follower coupled to a PMOS inverting stage. Load resistor 64 sets the voltage to current conversion for the amplifier. External load 60 (current source) can be supplied off chip. The floating gate detection node 56 is a CCD detection node as described in U.S. Pat. No. 5,491,354 "Floating Gate Charge Detection Node", issued Feb. 13, 1996.

Figure 1:
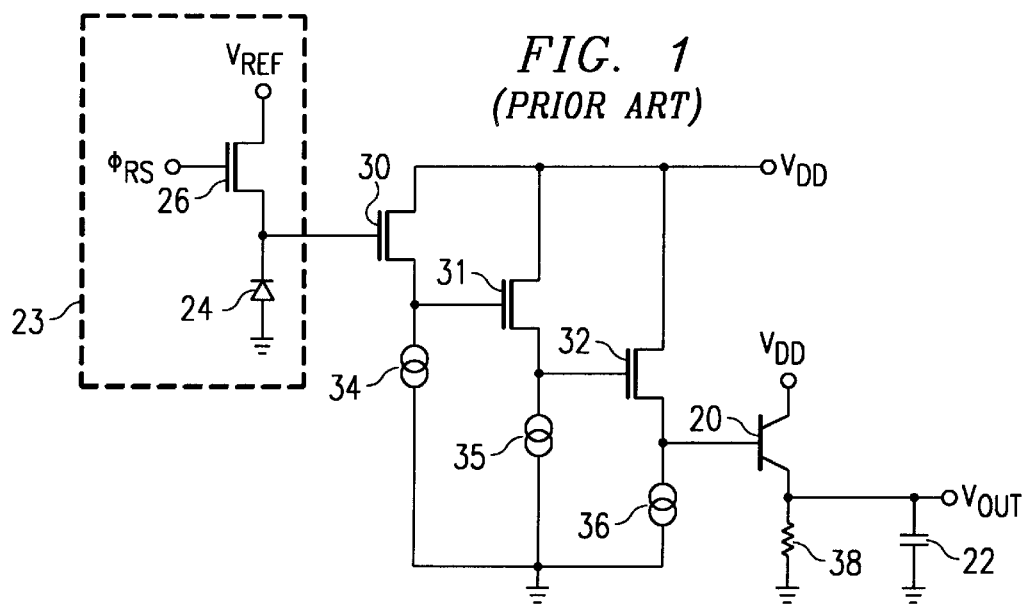
FIG. 1 is a schematic diagram of a prior art charge detection amplifier.

Other detection nodes such as a standard floating diffusion with reset means can also be used. The floating diffusion circuit 23, shown in FIG. 1, can be used in place of the floating gate circuit 55, shown in FIG. 2. The floating diffusion detection node is described in U.S. Pat. No. 5,151,380 "Method of Making Top Buss Virtual Phase Frame Interline Transfer CCD Image Sensor", issued Sep. 29, 1992.

An advantage of the virtual phase CCD technology is the presence of an intrinsic PMOS transistor. The PMOS transistor 50 of the output circuit of FIG. 2 is built in the virtual phase CCD process. The P+ virtual phase implants can serve as source and drain for PMOS transistor 50.

The circuit of FIG. 2 provides a current output with only a small voltage swing at the output node 62 when coupled to an external current feedback amplifier. The small voltage swing greatly reduces the negative impact of parasitic capacitance at the output node. The circuit of FIG. 2 also provides the advantages of extreme simplicity, reduced number of pins, positive feedback to the drain of transistor 52 which reduces Miller capacitance and improves sensitivity, and a direct interface with external current feedback amplifiers.

Figure 3:
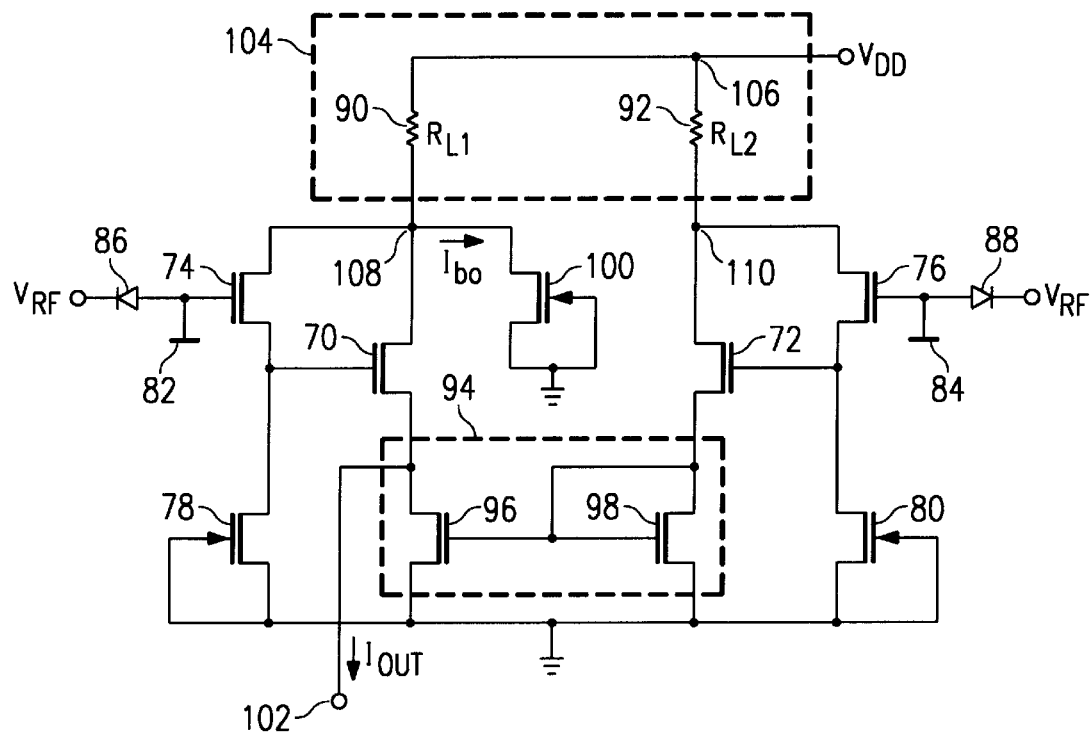
FIG. 3 is a schematic diagram of a preferred embodiment CCD current output charge detection amplifier in a differential configuration.

The circuit of FIG. 2 can be used in a differential configuration as shown in FIG. 3. The circuit of FIG. 3 includes PMOS transistors 70 and 72, NMOS transistors 74 and 76, transistors 78 and 80 which provide constant current loads for transistors 74 and 76, floating gate detection nodes 82 and 84, diodes 86 and 88, reference voltage $V_{RF}$, gain adjusting circuit 104 which includes resistors 90 and 92 and nodes 106, 108, and 110, current mirror 94 which includes NMOS transistors 96 and 98, optional current balance transistor 100, current balance transistor current $I_{b0}$, output node 102, output current $I_{out}$ and supply voltage $V_{dd}$. PMOS transistors 70 and 72 perform the same function as PMOS transistor 50 in FIG. 2. NMOS transistors 74 and 76 perform the same function as NMOS transistor 52 in FIG. 2. Load transistors 78 and 80 perform the same function as load transistor 54 in FIG. 2. Diodes 86 and 88 perform the same function as diode 58 in FIG. 2. Floating gate detection nodes 82 and 84 are the same type of detection node as floating gate detection node 56 in FIG. 2. Floating gate detection node 84 is a dummy detection node. Current balance transistor 100 is an optional transistor used for current balance when detection nodes 82 and 84 are not the same size. The output from node 102 is a current $I_{out}$.

Figure 4:
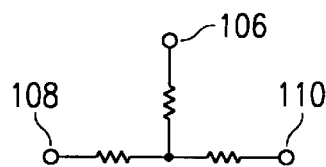
FIGS. 4 and 5 are optional gain adjusting circuits for the device of FIG. 3
Figure 5:
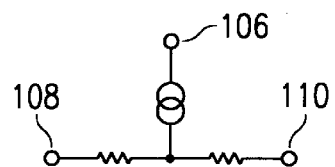

Resistors 90 and 92 of the gain adjusting circuit 104 are used to set the voltage to current conversion. Other circuit configurations, such as those shown in FIGS. 4 and 5, can be used for the gain adjusting circuit 104. The circuit of FIG. 4 includes resistors 111, 112, and 113. The circuit of FIG. 5 includes current source 115 and resistors 116 and 117. Nodes 106, 108, and 110 in FIGS. 4 and 5 correspond with the nodes of the same number in FIG. 3.

The circuit of FIG. 3 is a differential circuit for canceling out drifts in the DC bias voltages. The dummy circuit has no image signal coming to the dummy floating gate 84, so the bias of the dummy floating gate 84 generates a current which is mirrored to transistor 96 to cancel out drifts in the DC bias voltages at the output current $I_{out}$.

The circuit of FIG. 3 can be designed symmetrically so that the dummy input can be used for signal subtraction. For example, a CCD smear channel (as described in U.S. Pat. No. 5,430,481 "Multimode Frame Transfer Image Sensor", issued Jul. 4, 1995) can be used to supply the signal to the dummy gate 84. For this case, $I_{b0}=0$.

The circuit of FIG. 3 can also be designed asymmetrically. The dummy detection node can be built larger by a factor a, to minimize noise while the current mirror circuit 94 can be built smaller by a factor $B_1$ to minimize the power consumption. In this case, current balancing transistor 100 is added to the signal channel with the current equation given by $I_{b0}=(a_1/B_1-1)I_{b1}$, where $R_{L1}=B_1 R_{L2}$. These equations must be satisfied to balance the circuit. If the dummy floating gate 84 and the dummy diode 88 are scaled by the same factor $a_1$, the circuit will also balance line droop caused by the leakage current of the diode 86. $V_{RF}$ can be pulsed negative every line or frame of the image signal to keep the floating gate 82 properly biased in the saturation region of the diode 86.

Figure 6:
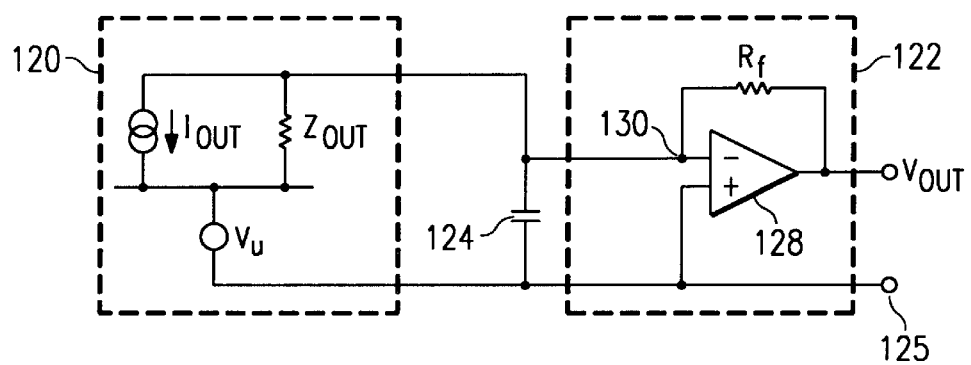
FIG. 6 is a schematic diagram of a model of the circuit of FIG. 3 and an external current feedback amplifier.

The circuit of FIG. 6 includes CCD circuit 120, which is a model for the circuit of FIG. 3, a current feedback amplifier 122, parasitic capacitance 124, output voltage $V_{out}$, and ground node 125. The circuit 120 of FIG. 6 includes $I_{out}$ which corresponds with the current $I_{out}$ at node 102 in FIG. 3, $Z_{out}$ which is the output impedance at node 102 in FIG. 3, CCD substrate ground 126, and CCD substrate noise and bias voltage $v_u$ induced by the CCD clocking. Current feedback amplifier 122 includes op amp 128 and feedback resistor $R_f$.

The output from the CCD circuit 120 is fed into a low impedance input 130 of the current feedback amplifier 122. $V_{out}$ is given by the following equation: $V_{out}=v_u(R_f/Z_{out})+I_{out}R_f$. Since $Z_{out}$ is large in the circuit of FIG. 3, $V_{out}$ is approximately $I_{out}R_f$ and the negative effects of $v_u$ have been minimized. Also, the negative effect of the loading from parasitic capacitance 124 has been reduced.

The circuit of FIG. 6 provides several advantages. High frequency performance is provided because of the low impedance input of the off-chip stage 122 (current feedback amplifier). The effect of the parasitic capacitance is minimized. The clock noise on the CCD substrate induced by driving the CCD is minimized.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A current output amplifier for a charge coupled device comprising:

a charge detection node;

a first transistor having a gate coupled to the charge detection node;

a second transistor having a gate coupled to a source of the first transistor and a drain coupled to an output node;

a constant current source coupled to the drain of the second transistor; and a resistor coupled to a source of the second transistor.

2. A current output amplifier for a charge coupled device comprising:

a first transistor;

a floating gate coupled to a gate of the first transistor;

a bias diode coupled between the gate of the first transistor and a voltage reference node;

a second transistor having a gate coupled to a source of the first transistor and a drain coupled to an output node; and a constant current source coupled to the drain of the second transistor.

3. A differential current output amplifier for a charge coupled device comprising:

a first charge detection node;

a first transistor having a gate coupled to the first charge detection node;

a second transistor having a gate coupled to a source of the first transistor and a drain coupled to an output node;

a second charge detection node;

a third transistor having a gate coupled to the second charge detection node;

a fourth transistor having a gate coupled to a source of the third transistor; and a current mirror having a first end coupled to the drain of the second transistor and a second end coupled to a drain of the fourth transistor.

4. The device of claim 3 further comprising:

a first resistor coupled between a source of the second transistor and a first node; and a second resistor coupled between a source of the fourth transistor and the first node.

5. The device of claim 4 further comprising a third resistor coupled between the first node and a voltage source node.

6. The device of claim 4 further comprising a current source coupled between the first node and a voltage source node.

7. The device of claim 3 wherein the first and second charge detection nodes are floating gate charge detection nodes.

8. The device of claim 7 further comprising:

a first diode coupled to the first charge detection node; and a second diode coupled to the second charge detection node.

9. The device of claim 3 further comprising a current feedback amplifier having an input coupled to the output node.

10. The device of claim 3 further comprising:

a first constant current load coupled to the source of the first transistor; and a second constant current load coupled to the source of the third transistor.

11. The device of claim 3 further comprising a current balance transistor coupled to a source of the second transistor.

12. The device of claim 3 wherein the first and second charge detection nodes are floating diffusion detection nodes.

* * * * *